United States Patent [19]

Rellick

[11] 4,323,483
[45] Apr. 6, 1982

[54] MIXED OXIDE BONDED COPPER CONDUCTOR COMPOSITIONS

[75] Inventor: Joseph R. Rellick, Newark, Del.

[73] Assignee: E. I. Du Pont de Nemours and Company, Wilmington, Del.

[21] Appl. No.: 92,711

[22] Filed: Nov. 8, 1979

[51] Int. Cl.$^3$ .............................................. H01B 1/02
[52] U.S. Cl. .................................... 252/512; 252/518; 106/1.13; 106/1.18; 428/209; 428/901
[58] Field of Search ................ 252/512, 518; 428/409, 428/210, 469, 432, 209, 901; 106/1.05, 1.13, 1.18

[56] References Cited

U.S. PATENT DOCUMENTS

| | | | |
|---|---|---|---|
| B 553,421 | 3/1976 | Horowitz | 252/514 |
| 2,993,815 | 7/1961 | Treptow | 427/123 |
| 3,744,120 | 7/1973 | Burgess et al. | 29/494 |
| 3,766,634 | 10/1973 | Babcock et al. | 29/471.9 |
| 3,943,168 | 3/1976 | Patterson | 252/519 |
| 3,994,430 | 11/1976 | Cusano et al. | 228/122 |
| 4,001,146 | 1/1977 | Horowitz | 252/514 |
| 4,072,771 | 2/1978 | Grier | 427/96 |
| 4,122,232 | 10/1978 | Kuo | 252/512 X |
| 4,130,671 | 12/1978 | Nagesh et al. | 252/514 X |
| 4,172,919 | 10/1979 | Mitchell | 428/209 |

FOREIGN PATENT DOCUMENTS

| | | |
|---|---|---|
| 854473 | 11/1952 | Fed. Rep. of Germany . |
| 2222759 | 3/1972 | Fed. Rep. of Germany . |
| 1374763 | 12/1971 | United Kingdom . |

Primary Examiner—Joseph L. Schofer
Assistant Examiner—J. L. Barr

[57] ABSTRACT

Thick film copper conductor compositions useful for forming microwave conduit conductors are disclosed. The compositions contain copper, copper oxide, lead oxide and bismuth oxide dispersed in an inert liquid vehicle.

6 Claims, No Drawings

MIXED OXIDE BONDED COPPER CONDUCTOR COMPOSITIONS

TECHNICAL FIELD

This invention relates to thick film copper conductor compositions. More particularly, it relates to mixed oxide bonded thick film copper conductor compositions useful to prepare microwave circuit conductors.

BACKGROUND ART

Noble metal conductors made from thick film compositions containing a noble metal and a glass frit dispersed in a vehicle are well known in the electronics art. Beneficial characteristics such as low resistivity, good solderability and good adhesion to a ceramic substrate vary according to the particular ingredients selected. A useful composition containing a silver metal is described in U.S. Pat. No. 4,001,146. The high cost of silver and other noble metals has led to the search for other less expensive metals as conductors. Nickel and copper are in this category.

U.S. Pat. No. 3,943,168 describes conductor compositions containing nickel and a glass frit dispersed in an inert liquid vehicle. U.S. Pat. No. 4,072,771 describes conductor compositions containing copper and a glass frit dispersed in an inert liquid vehicle. Frit-bonded conductors, however, have generally been found to develop a glass-rich interlayer between the conductor and ceramic substrate after firing. This interlayer inhibits heat transfer between conductor and substrate and being brittle is subject to cracking during thermal cycling with concomitant loss of adherence. It is also a region of low electrical conductivity. Low conductivity is particularly deleterious in circuits operating at microwave frequencies of 1 GHz and above.

DISCLOSURE OF INVENTION

This invention provides a conductor composition containing the desired copper, but without the need to add a glass frit. The compositions provide a conductor useful in microwave circuits. The conductor exhibits low resistivity, good solderability and good adhesion to a ceramic substrate.

The composition of this invention is a mixture of copper, copper oxide ($Cu_2O$) and one or both of lead oxide (PbO) and bismuth oxide ($Bi_2O_3$) in an inert liquid vehicle. The resulting paste composition is screen printed on an alumina substrate and following drying is fired in a nitrogen atmosphere at between 900° C. and 1060° C. The resulting conductive device can be used in electrical circuits operating at microwave frequencies of 1 GHz and above.

The compositions of this invention also can be used to make multilayer circuits for use on computer circuit boards. For this use alternate layers of the compositions of this invention are fired on dielectric substrates.

DETAILED DESCRIPTION OF THE INVENTION AND BEST MODE

Three components are critical in the compositions of this invention; namely, copper powder, copper oxide powder and one or both of lead oxide and bismuth oxide powder. An inert liquid vehicle is also needed to prepare the desired paste composition.

The copper powder has a particle size range of 0.1 to 10 micrometers and a preferred size in the 0.5 to 3 micrometer range. In terms of total inorganic solids, the copper powder content varies from 86 to 99 percent by weight. The preferred copper powder content is 94 to 98 percent by weight.

In terms of total inorganic solids, the copper oxide powder content varies from 0.3 to 12 percent by weight. The preferred copper oxide powder content is 0.75 to 5 percent by weight.

In terms of total inorganic solids, when present in the composition, the lead oxide powder content varies from 0.3 to 12 percent by weight. The preferred lead oxide powder content is 0.75 to 5 percent by weight.

In terms of total inorganic solids, when present in the composition, the bismuth oxide powder content varies from 0.3 to 12 percent by weight. The preferred bismuth oxide powder content is 0.75 to 5 percent by weight.

All copper oxide, lead oxide and bismuth oxide powders will be present as finely divided particles. The term "finely divided" will be understood by those skilled in the thick film art to mean particles sufficiently fine to pass through a 400-mesh screen (U.S. standard sieve scale). It is preferred that substantially all the particles have a large dimension in the range 0.001–15 microns, the largest dimension more preferably being no larger than five microns.

The vehicle employed can be any of the organic liquids customarily employed with thick film compositions. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. Preferred is a vehicle comprising 13 percent by weight ethyl cellulose, 29 percent by weight terpineol and 58 percent by weight dibutylphthalate.

A solvent can also be present and customarily will be terpineol.

In terms of the total composition, the inorganic solids are present in the range of 65 to 90 percent by weight and the vehicle plus solvent in the range of 10 to 35 percent by weight. Most preferred is a composition with 82 to 90 percent by weight inorganic solids, five to nine percent by weight vehicle and five to nine percent by weight additional solvent. The composition is prepared by dispersing the powders in a vehicle and solvent medium. The resulting composition has a paste-like consistency.

The composition is screen printed on a ceramic dielectric substrate, typically alumina or beryllia and then dried at 120° C. for 15 minutes. Finally, the metallization is fired at a temperature in a range of 900° C. to 1060° C. with a dwell time at peak of about 15 minutes and a total cycle time of one hour. For optimum adhesion and conductivity the firing temperature range should be 1010° C. to 1060° C.

Examples of the composition and process of the present invention in which parts and percents are by weight, unless otherwise indicated, are as follows:

EXAMPLE I

Eighty-five percent copper powder, having a particle size of 0.3 to 5 micrometers; two percent of copper oxide; one percent bismuth oxide are dispersed in six percent of a vehicle consisting of 13 percent ethyl cellulose, 29 percent terpineol and 58 percent dibutylphthalate; and in six percent of terpineol solvent. The particles are dispersed by roll milling.

The resulting paste is screen printed through a 200-mesh patterned stainless steel screen onto a 96 percent alumina ceramic substrate. Following drying at 120° C. for 15 minutes, the parts are fired in a BTU ENGINEERING belt furnace in a nitrogen atmosphere, reaching a peak temperature of either 1010° C. or 1060° C. with a dwell time at peak of about 15 minutes and a total cycle time of one hour. Electrical resistance is measured on the nominally 200 square serpentine pattern using a Hewlett-Packard Model 4328A milliohmmeter. Width and thickness measurements of the fired line are made using a reticle equipped B&L binocular microscope and a Brush Surfanalyzer. These measurements, together with the measured resistance of the line, are used to calculate a sheet resistivity normalized to a thickness of one mil.

Dip soldering of the fired metallization is performed using Alpha 611 soldering flux and 62 Sn/36 Pb/2 Ag solder at a temperature of 220° C. Twenty gauge tinned copper wires are soldered across 80 mil metallization pads and the adhesion measured by bending the wire perpendicular to the substrate and pulling. Force to cause conductor pad separation from the substrate is noted on a Hunter Spring handheld force gauge. The properties of the metallization are as follows:

|  | Firing Temperature | |
|---|---|---|
|  | 1010° C. | 1060° C. |
| Conductivity | 1.1 mΩ/sq. | 1.1 mΩ/sq. |
| Solderability | Excellent | Excellent |
| Adhesion | 5.1 pounds | 7.0 pounds |
| Failure Mode | A | A + C mixed |

The failure mode designation "A" refers to a situation in which the copper metallization separates from the ceramic substrate. Mode "C" refers to a failure situation in which the wire pulls out of a solder fillet leaving the copper metallizations still attached to the substrate. In such a case, the only statement which can be made about the pad adhesion is that it exceeds the pull value observed.

EXAMPLE II

Eighty-three and one-half percent copper powder, having a particle size of 0.3 to 5 micrometers; three percent of copper oxide; one and one-half percent lead oxide are dispersed in five percent of ethyl cellulose vehicle and in three and one-half percent of dibutylcarbitol solvent and three and one-half percent dibutylphthalate solvent. The particles are dispersed by roll milling.

The resulting paste is screen printed through a 325 mesh patterned stainless steel screen onto a 96 percent alumina ceramic substrate. Following drying at 120° C. for 15 minutes, the parts are fired in a Lindberg belt furnace in a nitrogen atmosphere reaching a peak temperature of 900° C. with a dwell time at peak of about 10 minutes. Thereafter a layer of Du Pont dielectric 4175 is printed over the fired copper layer and is dried and fired in like manner. Subsequently another layer of the above-described copper composition is screen printed and fired onto the dielectric surface using like procedure.

The resulting multilayered structure is soldered with Alpha 611 flux and 60/40 tin/lead solder at 225° C. Solderability is found to be Good-Excellent based on visual inspection.

EXAMPLE III

Eighty-five percent copper powder, having a particle size of 0.3 to 5 micrometers; one percent of copper oxide; one percent of bismuth oxide and one percent of lead oxide are dispersed in six percent of ethyl cellulose vehicle and in six percent of terpineol solvent. The particles are dispersed by roll milling.

The resulting paste is screen printed through a 200-mesh patterned stainless steel screen onto a 96 percent alumina ceramic substrate. Following drying at 120° C. for 15 minutes, the parts are fired in a BTU ENGINEERING belt furnace in a nitrogen atmosphere, reaching a peak temperature of either 1010° C. or 1060° C. with a dwell time at peak of about 15 minutes and a total cycle time of one hour. Electrical resistance is measured in the same manner as described in Example I. Likewise, dip soldering is also measured as described in Example I.

The properties of the metallizations are as follows:

|  | Firing Temperature | |
|---|---|---|
|  | 1010° C. | 1060° C. |
| Conductivity | 1.0 mΩ/sq. | 1.19 mΩ/sq. |
| Solderability | Excellent | Excellent |
| Adhesion | 6.2 pounds | 5.2 pounds |
| Failure Mode | C | C |

I claim:

1. A thick film conductor composition for application to a dielectric ceramic substrate consisting essentially of a mixture of 65 to 90 percent by weight copper, copper oxide, and one or more of lead oxide and bismuth oxide powders and 10 to 35 percent by weight of a vehicle and solvent mixture.

2. A composition according to claim 1 wherein the inorganic solids comprise a copper content of 86 to 99 percent by weight, a copper oxide content of 0.3 to 12 percent by weight, a lead oxide content of 0 to 12 percent by weight and a bismuth oxide content of 0 to 12 percent by weight.

3. A composition according to claim 2 wherein the copper content is 94 to 98 percent by weight, the copper oxide 0.75 to 5 percent by weight, the lead oxide 0.75 to 5 percent by weight and the bismuth oxide 0.75 to 5 percent by weight.

4. A dielectric substrate having adhered thereto, a composition of claim 1.

5. A dielectric substrate having adhered thereto, a composition of claim 2.

6. A dielectric substrate having adhered thereto, a composition of claim 3.

* * * * *